(12) United States Patent
Ballapuram

(10) Patent No.: US 9,818,476 B1
(45) Date of Patent: *Nov. 14, 2017

(54) REPROGRAM WITHOUT ERASE USING CAPACITY IN MULTI-LEVEL NAND CELLS

(71) Applicant: Samsung Electronics Co., Ltd., Suwon-si, Gyeonggi-do (KR)

(72) Inventor: Chinnakrishnan Ballapuram, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/436,755

(22) Filed: Feb. 17, 2017

Related U.S. Application Data

(63) Continuation-in-part of application No. 15/256,494, filed on Sep. 2, 2016, now Pat. No. 9,627,049.

(60) Provisional application No. 62/366,621, filed on Jul. 25, 2016.

(51) Int. Cl.
  *G11C 16/04* (2006.01)
  *G11C 11/56* (2006.01)
  *G06F 12/02* (2006.01)

(52) U.S. Cl.
  CPC ...... *G11C 11/5628* (2013.01); *G06F 12/0246* (2013.01); *G11C 11/5642* (2013.01); *G11C 16/0483* (2013.01); *G06F 2212/7201* (2013.01)

(58) Field of Classification Search
  CPC . G11C 11/5628; G11C 11/5642; G11C 11/56; G11C 11/5621; G11C 16/06; G11C 16/10
  USPC ...................................... 365/185.03, 185.18
  See application file for complete search history.

(56) References Cited

U.S. PATENT DOCUMENTS

| | | |
|---|---|---|
| 5,815,434 A | 9/1998 | Hasbun et al. |
| 6,667,903 B2 | 12/2003 | De Sandre et al. |
| 8,879,319 B1 | 11/2014 | Cassuto et al. |
| 8,917,559 B2 | 12/2014 | Bisen |
| 9,070,453 B2 | 6/2015 | Sharon et al. |
| 2010/0074012 A1* | 3/2010 | Park ................... G11C 11/5628 365/185.03 |

* cited by examiner

*Primary Examiner* — Huan Hoang
(74) *Attorney, Agent, or Firm* — Renaissance IP Law Group LLP

(57) ABSTRACT

Inventive aspects include a memory device having one or more memory pages including a plurality of memory cells each having a plurality of programmable state levels. The memory device includes a memory control logic section including a program logic section and page-level reprogram state metadata. The program logic section may program the plurality of memory cells dependent on the page-level reprogram state metadata. The program logic section may program a first state level, a second state level, and a third state level of each of the memory cells in consecutive programming operations of the plurality of memory cells dependent on the page-level reprogram state metadata, without requiring any erase operations or read operations during or between the programming operations. Any combination of 1's bit, 2's bit, 4's bit, 8's bit, or $2^{(N-1)}$'s bit locations can be written to in a single program operation, as long as the lower order bits are not re-used for later writes, and proper state keeping is kept.

20 Claims, 8 Drawing Sheets

REPROGRAM WITHOUT ERASE USING CAPACITY IN MULTI-LEVEL NAND CELLS

BACKGROUND

The present inventive concepts relate to semiconductor circuits, and more particularly, to a reprogramming without erase technique using capacity in multi-level NAND cells.

A NAND memory cell is a type of non-volatile memory cell, which stores information even after the power has been removed from the cell. NAND cells store a data value by charge injection into a floating gate of a transistor, which changes a threshold voltage commonly referred to as Vth. Some kinds of NAND memory cells may store multiple bits of information at the same time. For example, while a single-level cell (SLC) may only store a single bit representing one of two state levels (i.e., a logical 0 or 1), a multi-level cell (MLC) may store multiple bits. For example, an MLC may store four state levels representing a logical 0, 1, 2, or 3, which may be represented in binary code as 00, 01, 10, and 11. A triple-level cell (TLC) may store eight state levels representing a logical 0, 1, 2, 3, 4, 5, 6, or 7, which may be represented in binary code as 000, 001, 010, 011, 100, 101, 110, and 111.

Most conventional NAND devices require that the memory cells be erased each time before programming new data into the cell. Those that do not require an erase for each program nevertheless require an extra read to gather state information prior to the next write. The extra erase and read operations increase energy consumption. In addition, erase cycles cause degradation and additional wear on the memory cells, thus reducing the life of the devices.

Write amplification is another problem that is common among conventional NAND devices. Because the memory cells are erased each time before reprogramming the data values, the process to perform these operations results in moving the data values more than once. In some cases, reprogramming the data values requires an already-programmed portion of the memory to be read, updated, and written to a new location. Sometimes different portions of memory must be erased and rewritten to accommodate the new data writes. The different portions might be larger than what was originally going to be written as the new data. This has a multiplying effect that increases the number of writes required over the life of the NAND memory devices. Such churning of data shortens the time that the NAND memory devices may reliably operate.

BRIEF SUMMARY

Inventive concepts may include a memory device having one or more memory pages including a plurality of memory cells each having a plurality of programmable state levels, and a memory control logic section coupled to the one or more memory pages, the memory control logic section including a program logic section and page-level reprogram state metadata. The program logic section is configured to program a first state level associated with one or more of a first through Nth power of two of each of the memory cells, in a first programming of the plurality of memory cells dependent on a first value of the page-level reprogram state metadata. The program logic section is configured to program a second state level associated with one or more of a second through Nth power of two of each of the memory cells in a second programming of the plurality of memory cells dependent on a second value of the page-level reprogram state metadata, without reading the first state level of any of the plurality of memory cells.

Inventive aspects may further include a method for programming multi-level non-volatile memory cells. The method may include storing, by a memory control logic section, page-level reprogram state metadata. The method may include programming, by a program logic section of the memory control logic section, a plurality of memory cells of a memory page dependent on the page-level reprogram state metadata. The method may include programming, by the program logic section, a first state level associated with one or more of a first through Nth power of two of each of the memory cells in a first programming of the plurality of memory cells dependent on a first value of the page-level reprogram state metadata. The method may include programming, by the program logic section, a second state level associated with one or more of a second through Nth power of two of each of the memory cells in a second programming of the plurality of memory cells dependent on a second value of the page-level reprogram state metadata, without reading the first state level of any of the plurality of memory cells.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Reference will now be made in detail to embodiments of the inventive concept, examples of which are illustrated in the accompanying drawings. Embodiments of the present inventive concept relate to a technique for performing multiple reprogram operations on NAND memory cells without intervening erase cycles—thereby reducing write time, reducing write amplification, and reducing erase, read, and write cycles. Using the disclosed technique, read-modify-write operations need not be performed. Instead, a previous program level may be stored as page-level reprogram state metadata, which may be referenced for the next program level. The capacity within multilevel NAND memory cells may be used to store a reduced number of bits than usual, but with the advantage of a reduction in erase cycles, read cycles, and write cycles. Thus, the overall life of the NAND memory cells may be significantly lengthened.

Figure 1A:
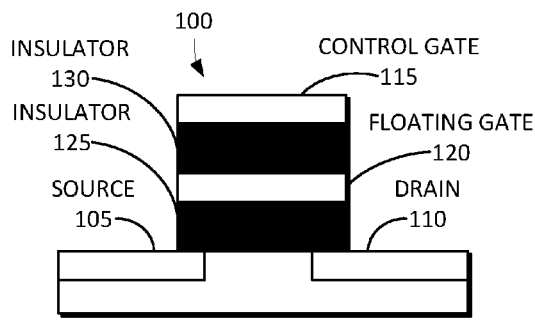
FIGS. 1A-1H are example diagrams of a non-volatile NAND memory cell having various programmable state levels.
Figure 1B:
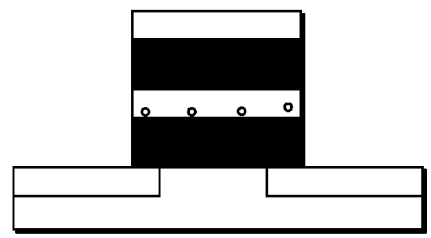
Figure 1C:
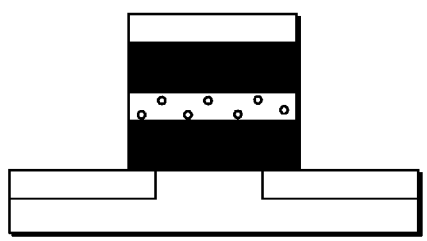
Figure 1D:
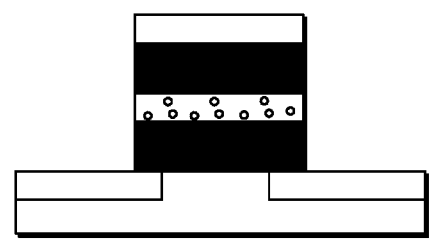
Figure 1E:
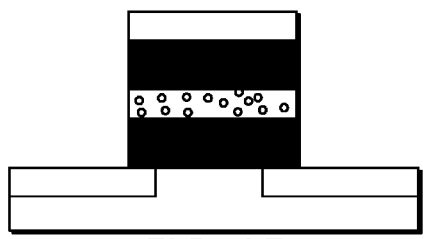
Figure 1F:
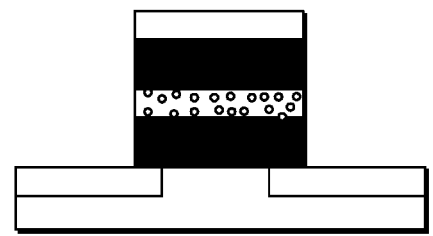
Figure 1G:
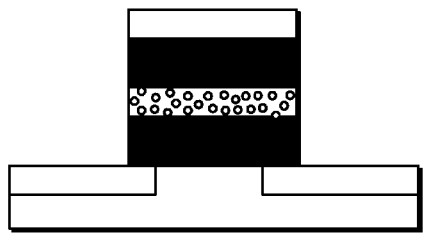
Figure 1H:
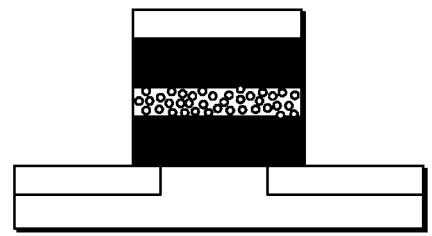

FIGS. 1A-1H are example diagrams of a non-volatile multi-level NAND memory cell 100 having various programmable state levels. FIG. 1A shows the non-volatile multi-level NAND memory cell 100 in a state having no stored charge. FIGS. 1B through 1H show the cell 100 having various states of stored charges, as further described below. The term "multi-level" as used herein is not intended to limit the kind of cells discussed only to "MLC" four-level type cells, but rather, the term as used herein may refer more broadly to a memory cell capable of storing multiple state levels and bits of four-levels and beyond. As shown in FIG. 1A, a NAND memory cell 100 may include a source 105, a drain 110, a control gate 115, and a floating gate 120. An insulator 125 is disposed between the floating gate 120 and the source 105 and drain 110. Another insulator 130 is disposed between the floating gate 120 and the control gate 115.

The floating gate 120 stores an electrical charge. Electrons may be injected into or ejected out of the floating gate 120 by way of tunneling through the insulator 125 responsive to an applied electric field. The threshold voltage Vth of the cell 100 changes depending on the amount of charge stored in the floating gate 120. Different state levels of the cell 100 (i.e., different levels of Vth) represent different data values. FIG. 1A shows the cell 100 having no charge stored in the floating gate 120. FIGS. 1B through 1H show the cell 100 having increasing levels of charge stored in the floating gate 120. In this example, the NAND memory cell 100 includes eight state levels. The memory cell 100 may be programmed to any one of these state levels. The eight state levels may be represented in binary code as 000, 001, 010, 011, 100, 101, 110, and 111. In other words, the eight different state levels of the cell 100 may be represented or conceptualized using three bits. Each bit position is a power of two. The right-most bit is referred to herein as the 1's bit. The middle bit is referred to herein as the 2's bit. And the left-most bit is referred to herein as the 4's bit.

It will be understood that the memory cell 100 is not limited to only eight state levels, but may include fewer state levels, such as four, or more state levels, such as sixteen. It will be understood that the memory cell 100 may include any suitable number of state levels. For example, in a sixteen state level cell, the state levels may be represented in binary code as 0000, 0001, 0010, 0011, 0100, 0101, 0110, 0111, 1000, 1001, 1010, 1011, 1100, 1101, 1110, and 1111. As with the four state level example described above, each bit position is a power of two. In this example, the right-most bit is referred to herein as the 1's bit, the next-right-most bit is referred to herein as the 2's bit, the next-next-right-most bit is referred to herein as the 4's bit, and the left-most bit is referred to herein as the 8's bit. This concept can be extended to N powers of two. N may be any suitable positive integer. For example, where N=5, the memory cell 100 may include $2^5$, or thirty-two, state levels.

Figure 2:
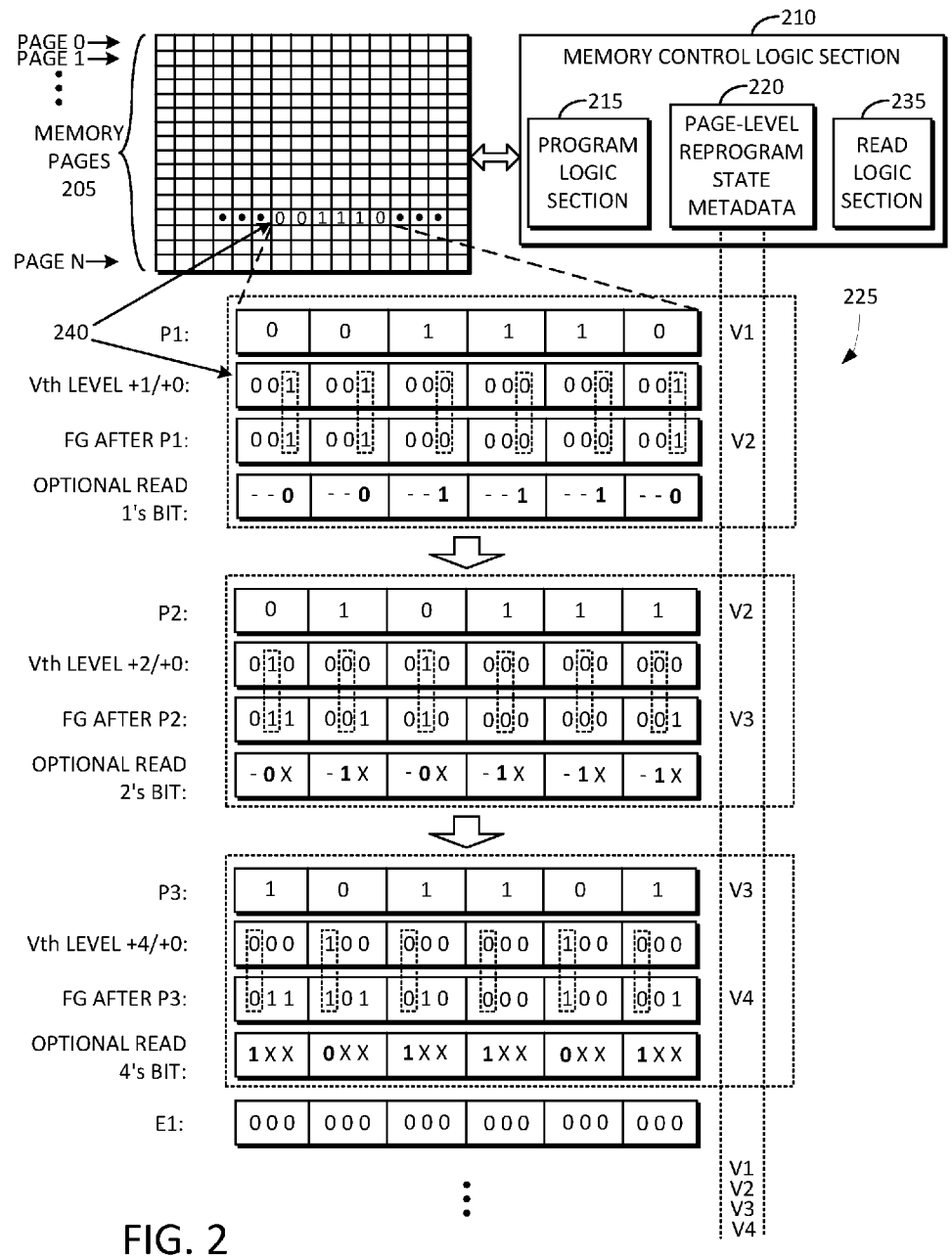
FIG. 2 is an example block and conceptual diagram showing a memory control logic section associated with memory pages, and a corresponding reprogram without erase flow using capacity in multi-level NAND memory in accordance with embodiments of the inventive concept.

FIG. 2 is an example block and conceptual diagram 225 showing a memory control logic section 210 associated with memory pages 205, and a corresponding reprogram without erase flow using capacity in multi-level NAND memory in accordance with embodiments of the inventive concept. The memory pages 205 may be arranged in rows, as shown in FIG. 2 by the Page 0 through Page N labels. The memory control logic section 210 may control the operation of the memory cells within each memory page. Each square within each memory page represents a multi-level NAND memory cell (e.g., 240). In this example embodiment, each memory cell is an eight level memory cell. The eight state levels may be represented in binary code as 000, 001, 010, 011, 100, 101, 110, and 111.

Three program operations (P1, P2, and P3) are illustrated, followed by a single erase operation E1. Erase operations need not be performed during or between the program operations. Moreover, read operations need not be performed during or between the program operations. In other words, there is no read of previous data required to update a new data bit. Each multi-level cell (e.g., 240) may be programmed (e.g., reprogrammed) multiple (e.g., 240, in the example of TLC cell to three) times with specific Vth levels (in this example embodiment from 000 to 111) to represent a new data bit without erasing an old data bit for the same address.

The memory control logic section 210 may include a program logic section 215, page-level reprogram state metadata 220, and a read logic section 235. The program logic section 215 may program the memory cells (e.g., 240) dependent on the page-level reprogram state metadata 220, as further described in detail below.

A first programming operation P1 is now described in which binary data "0 0 1 1 1 0" is programmed with each bit corresponding to an associated multi-level memory cell, such as memory cell 240 and to the memory cells adjacent to the memory cell 240. In other words, each data bit in the "0 0 1 1 1 0" string of data may be programmed to a separate multi-level memory cell. The program logic section 215 may program a first state level (e.g., 001, 001, 000, 000, 000, 001) associated with a first power of two (e.g., 1's bit) of each of the multi-level memory cells during the first programming operation P1 dependent on a first value V1 of the page-level reprogram state metadata 220. Using NAND, the complement of the actual logical value is stored to and read from the memory cells. For example, when a logical 0 is to be stored, a state level of 001 may be written to the multi-level memory cell during the first programming operation P1. By way of another example, when a logical 1 is to be stored, a state level of 000 may be written to the multi-level memory cell during the first programming operation P1.

More specifically, the first value V1 of the page-level reprogram state metadata 220 may indicate that no information is stored yet in the memory cells (e.g., 240) of a particular memory page—for example, that the Vth of the memory cells (e.g., 240) is freshly erased and at its lowest state level. In response to the page-level reprogram state metadata 220 being the first value V1, the program logic section 215 may program the 1's bit of each of the memory cells (e.g., 240) to represent each data bit in the "0 0 1 1 1 0" string of data to be programmed. In this example embodiment, electrical charge is added to the memory cell 240 to bring its threshold voltage Vth up to a state level representing "0 0 1." In a similar fashion, the memory cell to the right of memory cell 240 also has electrical charge added to bring its threshold voltage Vth up to a state level representing "0 0 1." The next three memory cells have no additional charge added during the programming operation P1. And the next memory cell is similar to the first two memory cells, in that electrical charge is added to bring its threshold voltage Vth up to a state level representing "0 0 1."

Accordingly, some of the floating gates (e.g., 120 of FIG. 1) of the memory cells receive an added charge (+1) to represent a logical value of 0. Moreover, some of the memory cells receive no added charge (+0) to represent a logical value of 1. In this manner, the "0 0 1 1 1 0" logical values may be programmed into the 1's bit locations of the memory cells. The program logic section 215 may program the first state level (e.g., 001, 001, 000, 000, 000, 001) associated with the first power of two (e.g., 1's bit) of each of the memory cells during the first programming operation P1 without erasing any bit from among the memory cells being programmed. As part of (or after) the programming operation P1, the memory control logic section 210 may set the page-level reprogram state metadata 220 to a second value V2, which indicates that one level of programming has occurred.

A second programming operation P2 is now described in which binary data "0 1 0 1 1 1" is programmed to the corresponding multi-level memory cells, such as memory cell 240 and to the memory cells adjacent to the memory cell 240. In other words, each data bit in the "0 1 0 1 1 1" string of data may be programmed to a separate multi-level memory cell. The program logic section 215 may program a second state level (e.g., 011, 001, 010, 000, 000, 001) associated with a second power of two (e.g., 2's bit) of each of the multi-level memory cells during the second programming operation P2 dependent on the second value V2 of the page-level reprogram state metadata 220, without reading the first state level associated with the first power of two (e.g., 1's bit) of any of the memory cells being programmed.

More specifically, the second value V2 of the page-level reprogram state metadata 220 may indicate that a first level of programming has already occurred on the memory cells (e.g., 240) of a particular memory page—for example, that the Vth of the memory cells (e.g., 240) is at certain state levels indicating that the 1's bit information has been programmed. In response to the page-level reprogram state metadata 220 being the second value V2, the program logic section 215 may program the 2's bit of each of the memory cells (e.g., 240) to represent each data bit in the "0 1 0 1 1 1" string of data to be programmed. In this example embodiment, electrical charge is added to the memory cell 240 to bring its threshold voltage Vth up to a state level representing "0 1 1." Such a programming operation is additive and requires neither an erase nor a read of the memory cell 240. In other words, during the programming operation P2, the program logic section 215 may either add additional charge to bring the threshold voltage Vth up (+2) by two levels (as in the case of memory cell 240), or to otherwise add zero charge (+0) to the memory cell (as in the case of the memory cell to the right of the memory cell 240).

Accordingly, the memory cell to the right of memory cell 240 has zero electrical charge added, which means that no change is made to its threshold voltage Vth, and thus, its state level remains at "0 0 1." The next memory cell to the right has additional charge added to bring the threshold voltage Vth up (+2) by two levels to a state level representing "0 1 0." In this manner, the 1's bit information is preserved irrespective of whether additional charge is added or not. The next three memory cells have no additional charge added during the programming operation P2, thereby preserving the 1's bit information, while also leaving the 2's bit information unchanged.

Accordingly, some of the floating gates (e.g., 120 of FIG. 1) of the memory cells receive an added charge (+2) to represent a logical value of 0 in the two's place. Moreover, some of the memory cells receive no added charge (+0) to represent a logical value of 1 in the two's place. In this manner, the "0 1 0 1 1 1" logical values may be programmed into the 2's bit locations of the memory cells. The program logic section 215 may program the second state level (e.g., 011, 001, 010, 000, 000, 001) associated with a second power of two (e.g., 2's bit) of each of the memory cells during the second programming operation P2 without erasing any bit from among the memory cells being programmed. As part of (or after) the programming operation P2, the memory control logic section 210 may set the page-level reprogram state metadata 220 to a third value V3, which indicates that two levels of programming have occurred.

A third programming operation P3 is now described in which binary data "1 0 1 1 0 1" is programmed to the corresponding multi-level memory cells, such as memory cell 240 and to the memory cells adjacent to the memory cell 240. In other words, each data bit in the "1 0 1 1 0 1" string of data may be programmed to a separate multi-level memory cell. The program logic section 215 may program a third state level (e.g., 011, 101, 010, 000, 100, 001) associated with a third power of two (e.g., 4's bit) of each of the multi-level memory cells during the third programming operation P3 dependent on the third value V3 of the page-level reprogram state metadata 220, without reading the first state level associated with the first power of two (e.g., 1's bit) and/or the second state level associated with the second power of two (e.g., 2's bit) of any of the memory cells being programmed.

More specifically, the third value V3 of the page-level reprogram state metadata 220 may indicate that the first and second levels of programming have already occurred on the memory cells (e.g., 240) of a particular memory page—for example, that the Vth of the memory cells (e.g., 240) is at certain state levels indicating that the 2's bit information has been programmed. In response to the page-level reprogram state metadata 220 being the third value V3, the program logic section 215 may program the 4's bit of each of the memory cells (e.g., 240) to represent each data bit in the "1 0 1 1 0 1" string of data to be programmed. In this example embodiment, zero electrical charge is added to the memory cell 240, which means that no change is made to its threshold voltage Vth, and thus, its state level remains at "0 1 1." The next memory cell to the right has additional charge added to bring the threshold voltage Vth up (+4) by four levels to a state level representing "1 0 1." In this manner, the 1's bit and 2's bit information is preserved irrespective of whether additional charge is added or not. Such a programming operation is additive and requires neither an erase nor a read of the memory cell 240. In other words, during the programming operation P3, the program logic section 215 may either add additional charge to bring the threshold voltage Vth up (+4) by four levels (as in the case of memory cell to the right of the memory cell 240), or to otherwise add zero charge (+0) to the memory cell (as in the case of the memory cell 240).

Accordingly, the memory cell to the right of memory cell 240 has additional electrical charge added, which means that its threshold voltage Vth is changed, and thus, its state level is changed to "1 0 1." The next two memory cells to the right have no additional charge added during the programming operation P3, thereby preserving the 1's bit and the 2's bit information, while also leaving the 4's bit information unchanged. In this manner, the 1's bit and the 2's bit information is preserved irrespective of whether additional charge is added or not. The next memory cell over has additional charge added (+4) during the programming operation P3, thereby updating the 4's bit information, while preserving the 1's bit and 2's bit information. The next memory cell over has no additional charge added during the programming operation P3, thereby preserving the 1's bit and the 2's bit information, while also leaving the 4's bit information unchanged.

Accordingly, some of the floating gates (e.g., 120 of FIG. 1) of the memory cells receive an added charge (+4) to represent a logical value of 0. Moreover, some of the memory cells receive no added charge (+0) to represent a logical value of 1. In this manner, the "1 0 1 1 0 1" logical values may be programmed into the 4's bit locations of the memory cells. The program logic section 215 may program the third state level (e.g., 011, 101, 010, 000, 100, 001) associated with the third power of two (e.g., 4's bit) of each of the memory cells during the third programming operation P3 without erasing any bit from among the memory cells being programmed. As part of (or after) the programming operation P3, the memory control logic section 210 may set the page-level reprogram state metadata 220 to a fourth value V4, which indicates that three levels of programming have occurred.

In some embodiments, the page-level reprogram state metadata 220 is a two-bit value capable of representing four values (V1, V2, V3, and V4). For example, if the page-level reprogram state metadata 220 is equivalent to V1 or '00,' this may indicate that no programming has occurred on a particular memory page, and/or that the memory page is erased. If the page-level reprogram state metadata 220 is equivalent to V2 or '01,' this may indicate that one level of programming has occurred on the particular memory page. If the page-level reprogram state metadata 220 is equivalent to V3 or '10,' this may indicate that two levels of programming have occurred on the particular memory page. And if the page-level reprogram state metadata 220 is equivalent to the V4 or '11,' this may indicate the three levels of programming have occurred on the particular memory page. It will be understood that the page-level reprogram state metadata 220 need not be limited to a two-bit value, but may be stored and accessed using any suitable binary representation. Other combinations of bit values to page-level reprogram state metadata 220 values may be used without departing from the scope of the inventive embodiments disclosed herein.

Accordingly, the program logic section 215 may program the first state level (e.g., '001') associated with the first power of two (e.g., 1's bit), the second state level (e.g., '011') associated with the second power of two (e.g., 2's bit), and the third state level (e.g., '111') associated with the third power of two (e.g., 4's bit) at a same address (i.e., an address associated with memory cell 240) without erasing any bit from among the memory cells during or between programming of the first state level, the second state level, and the third state level. The program logic section 215 may program the first state level associated with the first power of two (e.g., 1's bit) of each of the memory cells during the first programming operation P1 without erasing any bit from among the memory cells being programmed. The program logic section 215 may program the second state level associated with the second power of two (e.g., 2's bit) of each of the memory cells during the second programming operation P2 without erasing any bit from among the memory cells being programmed. The program logic section 215 may program the third state level associated with the third power of two (e.g., 4's bit) of each of the memory cells during the third programming operation P3 without erasing any bit from among the memory cells being programmed.

The memory control logic section 210 may include a read logic section 235. The first state level (e.g., 001, 001, 000, 000, 000, 001) of each of the memory cells may correspond to a first value of the threshold voltage Vth. The first value of the threshold voltage Vth includes information stored in a bit location associated with the first power of two (e.g., 1's bit) of each of the memory cells. The read logic section 235 may optionally read the information stored in the bit location associated with the first power of two (e.g., 1's bit) of each of the memory cells dependent on the second value V2 of the page-level reprogram state metadata 220. The logical value is the complement of the information stored in the 1's bit. In other words, the read logic section 235 may access the page-level reprogram state metadata 220, determine that it has the second value V2, and based on that determination, know to read the 1's bit information. Such a read operation may occur at any time after the 1's bit information has been programmed, but reading is not required for the programming operations described above to be successfully carried out.

The second state level (e.g., 011, 001, 010, 000, 000, 001) of each of the memory cells may correspond to a second value of the threshold voltage Vth. The second value of the threshold voltage Vth includes information stored in a bit location associated with the second power of two (e.g., 2's bit) of each of the memory cells. The read logic section 235 may optionally read the information stored in the bit location associated with the second power of two (e.g., 2's bit) of each of the memory cells dependent on the third value V3 of the page-level reprogram state metadata 220. In other words, the read logic section 235 may access the page-level reprogram state metadata 220, determine that it has the third value V3, and based on that determination, know to read the 2's bit information. Such a read operation may occur at any time after the 2's bit information has been programmed, but reading is not required for the programming operations described above to be successfully carried out.

The third state level (e.g., 011, 101, 010, 000, 100, 001) of each of the memory cells may correspond to a third value of the threshold voltage Vth. The third value of the threshold voltage Vth includes information stored in a bit location associated with a third power of two (e.g., 4's bit) of each of the memory cells. Even after a page has been written a second time, the first data is still available. Similarly, even after a page has been written a third time, the first and second data are still available. The read logic section 235 may optionally read the information stored in the bit location associated with the third power of two (e.g., 4's bit) of each of the memory cells dependent on the fourth value V4 of the page-level reprogram state metadata 220. In other words, the read logic section 235 may access the page-level reprogram state metadata 220, determine that it has the fourth value V4, and based on that determination, know to read the 4's bit information. Such a read operation may occur at any time after the 4's bit information has been programmed, but reading is not required for the programming operations described above to be successfully carried out.

After the programming operations P1, P2, and P3 have occurred, the page may be marked as dirty, meaning that it cannot be written until the entire block is erased. Thereafter, the programming process may repeat by cycling through similar programming operations P1, P2, and P3, and values V1, V2, V3, and V4 of the page-level reprogram state metadata 220, as the case may be. Hence, only a single erase operation is needed for every three programming operations P1, P2, and P3. Data may be written to multiple consecutive memory cells within a memory page without an erase operation being performed as part of or during the write operations. Moreover, no read operations are required at any point during the programming operations, or during or between the programming operations. The reprogram operations may be to a partial or full memory page depending on the write request. The new state levels may be determined purely from the incoming new data bits. The page may further be divided into multiple smaller partial pages to support partial updates. The state metadata 220 may store V11, V12, . . . V1n representing first level values of a first partial page, where n is the maximum number of partial pages. The state metadata 220 may also store V21, V22, . . . V2n representing second level values of a second partial page. And similarly, Vn1, Vn2, . . . Vnn may represent last level values of a last partial page.

In this manner, successive writes may be performed using voltage levels associated with each of the memory cell's powers of 2. A first programming is performed on the 1's bit, a second on the 2's bit, and a third on the 4's bit. Metadata is used to determine how many times a memory page has been written, and hence, at what voltage levels a new program should occur, or what bit in the data can be read. The compare level after each program operation may be at least one greater than the previous two levels together. It will be understood that the first programming operation P1, the second programming operation P2, and the third programming operation P3 can be at any power of two, as long as they are mutually exclusive and properly tracked.

Traditionally, to program 6-bits of data (e.g., '0 0 1 1 1 0'), two triple-level memory cells are needed to store data bits 001 and 110. These data bits are updated twice after an initial write. To reprogram these 6-data bits twice after the initial write, six triple-level memory cells are needed, for a total of 18-bits of data, including an initial write, a second write, and a third write. In addition, two erase cycles for the initial write and second write are also performed. In contrast, using embodiments of the inventive concept disclosed herein, the same 18 bits or 6 memory cells (i.e., 3-bits to represent 1 bit of data), may be used, but without needing to perform erase operations. This technique allows reprogramming of memory cells without erasing (for a time), thereby providing faster write times and reducing erase cycles. As an additional advantage, the old data in the memory cells are also preserved, and may be read at any time. For example, a multiple check-point system may refer back to previously stored information, by reading an "older" bit in a memory cell. Put differently, the old data in the memory cells are preserved, and may be read at any time. By way of another example, a versioning system may refer back to the previously stored information, by reading an "older" bit in a memory cell.

In some embodiments, the reprogram state metadata 220 may be global to a particular memory page, and all memory cells within the particular memory page may use the same metadata value. In some embodiments, the reprogram state metadata 220 may be global to a block of memory pages. In some embodiments, the reprogram state metadata 220 may be global to multiple blocks of memory pages. In some embodiments, the reprogram state metadata 220 may be global to multiple memory pages within a memory block. In some embodiments, the reprogram state metadata 220 may be global to multiple memory cells within a particular memory page.

Traditionally, when using triple-level memory cells and updating three bits of data, a second cell location would need to be located. Updating those three bits of data again, a third cell location would need to be located. Effectively, nine bits of information would be consumed to update three bits of data three times, and erase operations would be needed two times to reclaim the old cells. Using the inventive technique disclosed herein, the same nine bits (i.e., 3-bits to represent 1 bit of data) may be used, but without performing erase operations. This technique allows reprogramming the memory cell without erasing, thereby providing faster write times and reducing erase cycles.

Figure 3A:
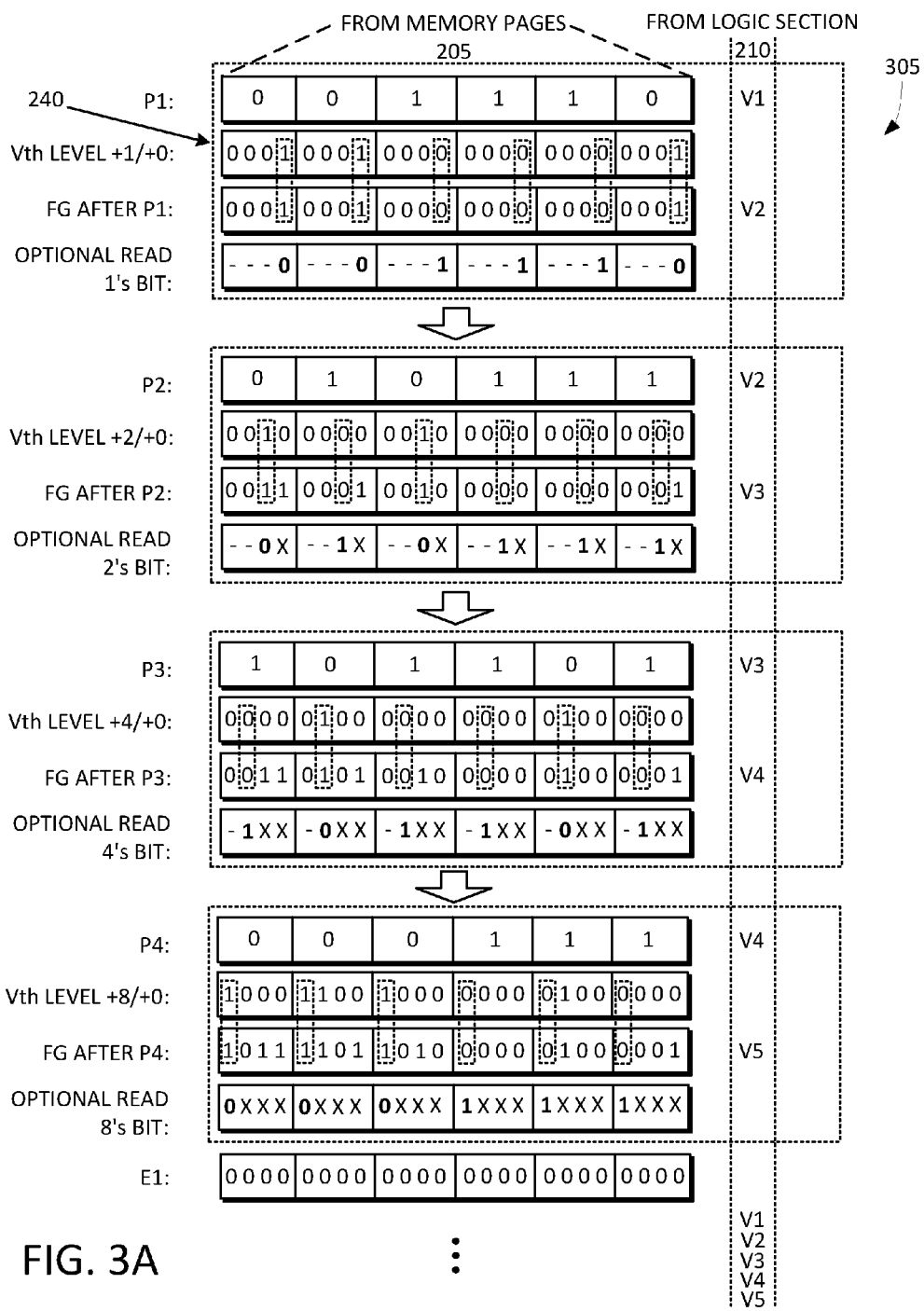
FIG. 3A is another example block and conceptual diagram showing a reprogram without erase flow using capacity in multi-level NAND memory in accordance with embodiments of the inventive concept.

FIG. 3A is another example block and conceptual diagram 305 showing a reprogram without erase flow using capacity in multi-level NAND memory in accordance with embodiments of the inventive concept. Some of the components and flow description are provided above with reference to FIG. 2, and therefore, a detailed description of such is not necessarily repeated. Of particular difference, each of the memory cells shown in FIG. 3A include sixteen state levels, which may be represented in binary code as 0000, 0001, 0010, 0011, 0100, 0101, 0110, 0111, 1000, 1001, 1010, 1011, 1100, 1101, 1110, and 1111. In this example embodiment, the right-most bit is referred to herein as the 1's bit, the next-right-most bit is referred to herein as the 2's bit, the next-next-right-most bit is referred to herein as the 4's bit, and the left-most bit is referred to herein as the 8's bit.

In an example embodiment, four programming operations (e.g., P1, P2, P3, and P4) can be performed before an erase operation (E1) is needed. The first three programming operations (e.g., P1, P2, and P3) can be carried out in a fashion similar to that described above with reference to FIG. 2, and therefore, a detailed description of each of those steps is not repeated. After the third programming operation P3 is completed, a fourth programming operation P4 can be performed.

A fourth programming operation P4 is now described in which binary data "0 0 0 1 1 1" is programmed to the corresponding multi-level memory cells, such as memory cell 240 and to the memory cells adjacent to the memory cell 240. In other words, each data bit in the "0 0 0 1 1 1" string of data may be programmed to a separate multi-level memory cell. The program logic section 215 may program a fourth state level (e.g., 1011, 1101, 1010, 0000, 0100, 0001) associated with a fourth power of two (e.g., 8's bit) of each of the multi-level memory cells during the fourth programming operation P4 dependent on the fourth value V4 of the page-level reprogram state metadata 220, without reading the first state level, the second state level, and/or the third state level of any of the memory cells being programmed.

More specifically, the fourth value V4 of the page-level reprogram state metadata 220 may indicate that the first, second, and third levels of programming have already occurred on the memory cells (e.g., 240) of a particular memory page—for example, that the Vth of the memory cells (e.g., 240) is at certain state levels indicating that the 4's bit information has been programmed. In response to the page-level reprogram state metadata 220 being the fourth value V4, the program logic section 215 may program the 8's bit of each of the memory cells (e.g., 240) to represent each data bit in the "0 0 0 1 1 1" string of data to be programmed. In this example embodiment, additional charge may be added to the memory cell 240 to bring the threshold voltage Vth up (+8) by eight levels to a state level representing "1 0 1 1." In this manner, the 1's bit, 2's bit, and 4's bit information is preserved irrespective of whether additional charge is added or not. Such a programming operation is additive and requires neither an erase nor a read of the memory cell 240. In other words, during the programming operation P4, the program logic section 215 may either add additional charge to bring the threshold voltage Vth up (+8) by eight levels (as in the case of memory cell 240, and the two memory cells to the write of the memory cell 240), or to otherwise add zero charge (+0) to the memory cell (as in the case of the right-most three memory cells).

For those memory cells in which an additional electrical charge is added, the threshold voltage Vth is changed, and thus, the state level for memory cell 240, for example, is changed to "1 1 0 1." The next two memory cells to the right have additional electrical charge added as well, which means that their threshold voltage Vth is also changed, and thus, their state level is changed to "1 1 0 1" and "1 0 1 0," respectively. The next three memory cells have no additional charge added during the programming operation P4, thereby preserving the 1's bit, the 2's bit, and the 4's bit information, while also leaving the 8's bit information unchanged. In this manner, the 1's bit, the 2's bit, the 4's bit, and the 8's bit information is preserved irrespective of whether additional charge is added or not.

Accordingly, some of the floating gates (e.g., 120 of FIG. 1) of the memory cells receive an added charge (+8) to represent a logical value of 0. Moreover, some of the memory cells receive no added charge (+0) to represent a logical value of 1. In this manner, the "0 0 0 1 1 1" logical values may be programmed into the 8's bit locations of the memory cells. The program logic section 215 may program the fourth state level (e.g., 1011, 1101, 1010, 0000, 0100, 0001) associated with the fourth power of two (e.g., 8's bit) of each of the memory cells during the fourth programming operation P4 without erasing any bit from among the memory cells being programmed. As part of (or after) the programming operation P4, the memory control logic section 210 may set the page-level reprogram state metadata 220 to a fifth value V5, which indicates that four levels of programming have occurred.

In some embodiments, the page-level reprogram state metadata 220 is a three-bit value capable of representing at least five values (V1, V2, V3, V4, and V5). For example, if the page-level reprogram state metadata 220 is equivalent to V1 or '000,' this may indicate that no programming has occurred on a particular memory page, and/or that the memory page is erased. If the page-level reprogram state metadata 220 is equivalent to V2 or '001,' this may indicate that one level of programming has occurred on the particular memory page. If the page-level reprogram state metadata 220 is equivalent to V3 or '010,' this may indicate that two levels of programming have occurred on the particular memory page. If the page-level reprogram state metadata 220 is equivalent to the V4 or '011,' this may indicate the three levels of programming have occurred on the particular memory page. And if the page-level reprogram state metadata 220 is equivalent to the V5 or '100,' this may indicate the four levels of programming have occurred on the particular memory page. It will be understood that the page-level reprogram state metadata 220 need not be limited to a three-bit value, but may be stored and accessed using any suitable binary representation. Other combinations of bit values to page-level reprogram state metadata 220 values can be used without departing from the scope of the inventive embodiments disclosed herein.

Accordingly, the program logic section 215 may program the first state level (e.g., '0001') associated with the first power of two (e.g., 1's bit), the second state level (e.g., '0011') associated with the second power of two (e.g., 2's bit), the third state level (e.g., '0011') associated with the third power of two (e.g., 4's bit), and the fourth state level (e.g., '1011') associated with the fourth power of two (e.g., 8's bit) at a same address (i.e., an address associated with memory cell 240) without erasing any bit from among the memory cells during or between programming of the first state level, the second state level, the third state level, and the fourth state level. The program logic section 215 may program the first state level associated with the first power of two (e.g., 1's bit) of each of the memory cells during the first programming operation P1 without erasing any bit from among the memory cells being programmed. The program logic section 215 may program the second state level associated with the second power of two (e.g., 2's bit) of each of the memory cells during the second programming operation P2 without erasing any bit from among the memory cells being programmed. The program logic section 215 may program the third state level associated with the third power of two (e.g., 4's bit) of each of the memory cells during the third programming operation P3 without erasing any bit from among the memory cells being programmed. The program logic section 215 may program the fourth state level associated with the fourth power of two (e.g., 8's bit) of each of the memory cells during the fourth programming operation P4 without erasing any bit from among the memory cells being programmed.

The fourth state level (e.g., 1011, 1101, 1010, 0000, 0100, 0001) of each of the memory cells may correspond to a fourth value of the threshold voltage Vth. The fourth value of the threshold voltage Vth includes information stored in a bit location associated with a fourth power of two (e.g., 8's bit) of each of the memory cells. The read logic section 235 may optionally read the information stored in the bit location associated with the fourth power of two (e.g., 8's bit) of each of the memory cells dependent on the fifth value V5 of the page-level reprogram state metadata 220. In other words, the read logic section 235 may access the page-level reprogram state metadata 220, determine that it has the fifth value V5, and based on that determination, know to read the 8's bit information. Such a read operation may occur at any time after the 8's bit information has been programmed, but reading is not required for the programming operations described above to be successfully carried out.

Thus, as compared to conventional technologies, which allow for only a single write of a 24 bit string, with an attendant erase operation before the next write operation, the example embodiment with reference to FIG. 3A allows for multiple 6 bit strings to be written up to four (4) times, without the usual erase or read operations interjected between the write operations.

Figure 3B:
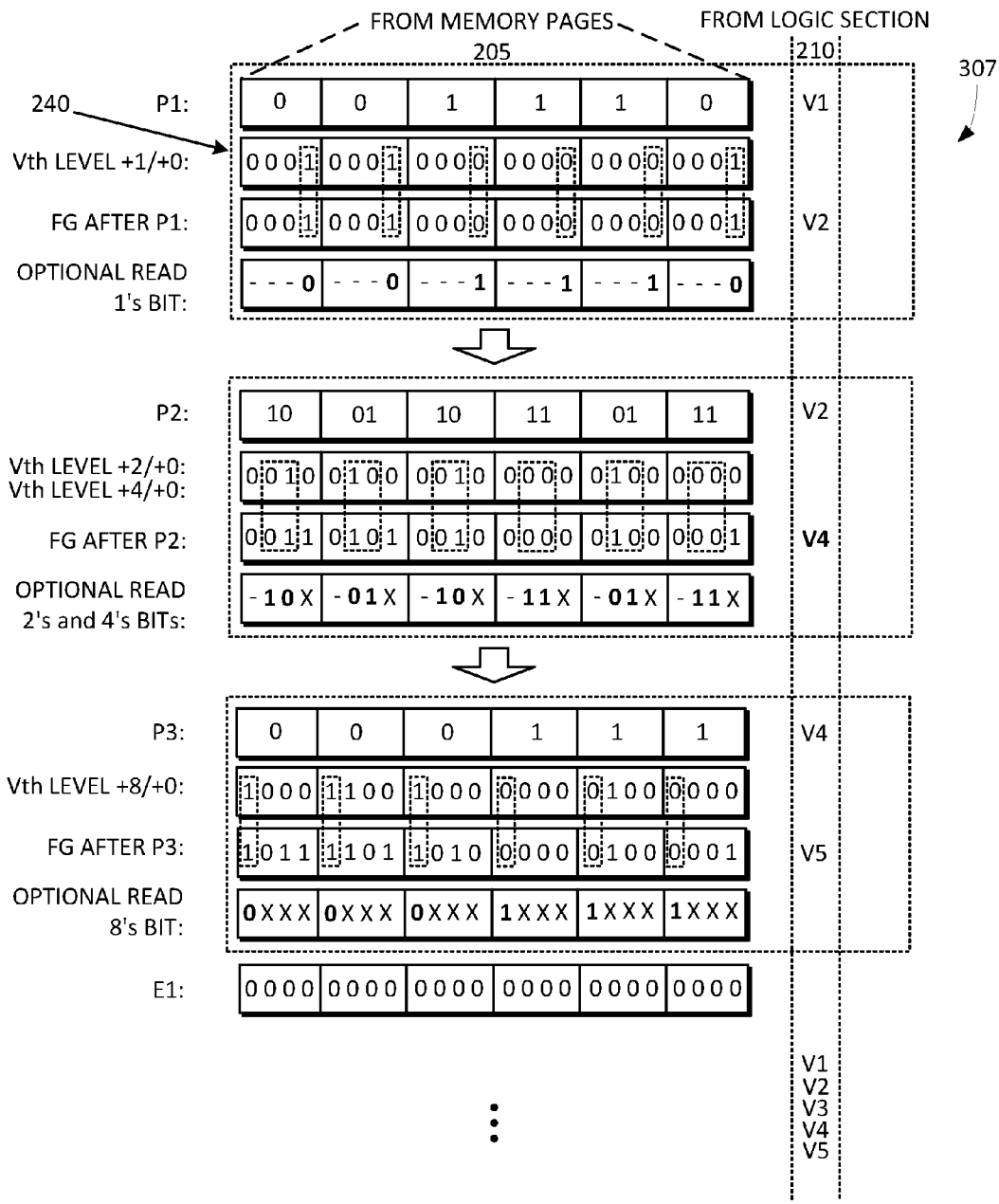
FIG. 3B is yet another example block and conceptual diagram showing a reprogram without erase flow using capacity in multi-level NAND memory in accordance with embodiments of the inventive concept.

FIG. 3B is yet another example block and conceptual diagram 307 showing a reprogram without erase flow using capacity in multi-level NAND memory in accordance with embodiments of the inventive concept. Some of the components and flow description are provided above with reference to FIG. 2, and therefore, a detailed description of such is not necessarily repeated. Of particular difference, each of the memory cells shown in FIG. 3B include sixteen state levels, which may be represented in binary code as 0000, 0001, 0010, 0011, 0100, 0101, 0110, 0111, 1000, 1001, 1010, 1011, 1100, 1101, 1110, and 1111. In this example embodiment, the right-most bit is referred to herein as the 1's bit, the next-right-most bit is referred to herein as the 2's bit, the next-next-right-most bit is referred to herein as the 4's bit, and the left-most bit is referred to herein as the 8's bit.

In some embodiments, the 1's bit, 2's bit, 4's bit, and 8's bit positions need not be programmed one at a time, using four separate program operations. For example, the 2's bit and 4's bit positions can be programmed during a same program operation. In this example, the 1's bit may be programmed in a first programming operation (e.g., P1), the 2's bit and 4's bit may be programmed in a second programming operation (e.g., P2), and the 8's bit may be programmed in a third programming operation (e.g., P3). This accomplishes only three total writes, but one of the writes is larger (e.g., 2 bits) than the other two programming operations. It will be understood that any combination of the 1's bit, the 2's bit, the 4's bit, and the 8's bit can be written to in a single program operation, as long as the lower order bits are not re-used for later writes, and the proper state keeping is kept. This provides a more versatile multiple write system.

More specifically, in an example embodiment, three programming operations (e.g., P1, P2, and P3) can be performed before an erase operation (E1) is needed. The first programming operation (e.g., P1) can be carried out in a fashion similar to programming operation P1 as described above with reference to FIG. 2, and therefore, a detailed description of that operation is not repeated. After the first programming operation P1 is completed, a two-bit programming operation (e.g., P2) can be performed.

The programming operation P2 is now described in which binary data "10, 01, 10, 11, 01, 11" is programmed to the corresponding multi-level memory cells, such as memory cell 240 and to the memory cells adjacent to the memory cell 240. In other words, each data bit pair in the "10, 01, 10, 11, 01, 11" string of data may be simultaneously programmed to different bit positions within different multi-level memory cells. The program logic section 215 may program a second state level (e.g., 0011, 0101, 0010, 0000, 0100, 0001) associated with a second power of two (e.g., 2's bit) and a third power of two (e.g., 4's bit) of each of the multi-level memory cells during the second programming operation P2 dependent on the second value V2 of the page-level reprogram state metadata 220, without reading the first state level associated with the first power of two (e.g., 1's bit) of any of the memory cells being programmed. The "10, 01, 10, 11, 01, 11" string of data may be stored on chip as "01, 10, 01, 00, 10, 00" data values. Put differently, the programming operation P2 may program one value having twice as many bits as the previous programming operation P1. For example, the programming operation P2 may program multi-bit values during a single programming operation, which may be optionally read out as single values (e.g., 10, 01, 10, 11, 01, and 11).

More specifically, the second value V2 of the page-level reprogram state metadata 220 may indicate that a first level of programming has already occurred on the memory cells (e.g., 240) of a particular memory page—for example, that the Vth of the memory cells (e.g., 240) is at certain state levels indicating that the 1's bit information has been programmed. In response to the page-level reprogram state metadata 220 being the second value V2, the program logic section 215 may program the 2's bit and the 4's bit of each of the memory cells (e.g., 240) to represent each data bit in the "10, 01, 10, 11, 01, 11" of data to be programmed. In this example embodiment, electrical charge is added to the memory cell 240 to bring its threshold voltage Vth up to a state level representing "0 0 1 1."

Such a programming operation is additive and requires neither an erase nor a read of the memory cell 240. In other words, during the programming operation P2, the program logic section 215 may (i) either add additional charge to bring the threshold voltage Vth up (+2) by two levels (as in the case of memory cell 240), or to otherwise add zero charge (+0) to the memory cell (as in the case of the memory cell to the right of the memory cell 240), and (ii) either add additional charge to bring the threshold voltage Vth up (+4) by four levels (as in the case of memory cell to the right of the memory cell 240), or to otherwise add zero charge (+0) to the memory cell (as in the case of the memory cell 240).

Put differently, the above can be structured as a write to the 2's bit and 4's bit locations simultaneously, where the charges that can be added include +0/+2/+4/+6 for the data bits 11, 10, 01, and 00 stored on chip, respectively. In some embodiments, values 11, 10, 01, and 00, respectively, can optionally be read out from the chip.

The 1's bit information is preserved irrespective of whether additional charge is added or not. Accordingly, some of the floating gates (e.g., 120 of FIG. 1) of the memory cells receive an added charge (+2/+4/+6) to represent a two-bit value stored in the two's and four's place. Moreover, some of the memory cells receive no added charge (+0) to represent a logical value of 1. In this manner, the "01, 10, 01, 00, 10, 00" values may be programmed into the 2's bit locations and 4's bit locations of the memory cells. The program logic section 215 may program the second state level (e.g., 0011, 0101, 0010, 0000, 0100, 0001) associated with a second power of two (e.g., 2's bit) and a third power of two (e.g., 4's bit) of each of the memory cells during the second programming operation P2 without erasing any bit from among the memory cells being programmed. As part of (or after) the programming operation P2, the memory control logic section 210 may set the page-level reprogram state metadata 220 to a third value V4 (i.e., skipping value V3), which indicates that two levels of programming have occurred, one of which was a two-bit programming operation.

A third programming operation P3 is now described in which binary data "0 0 0 1 1 1" is programmed to the corresponding multi-level memory cells, such as memory cell 240 and to the memory cells adjacent to the memory cell 240. In other words, each data bit in the "0 0 0 1 1 1" string of data may be programmed to a separate multi-level memory cell. The program logic section 215 may program a third state level (e.g., 1011, 1101, 1010, 0000, 0100, 0001) associated with a fourth power of two (e.g., 8's bit) of each of the multi-level memory cells during the third programming operation P3 dependent on the fourth value V4 of the page-level reprogram state metadata 220, without reading the first state level and/or the second state level of any of the memory cells being programmed.

More specifically, the fourth value V4 of the page-level reprogram state metadata 220 may indicate that the first and second levels of programming (including the 1's bit, the 2's bit, and the 4's bit) have already occurred on the memory cells (e.g., 240) of a particular memory page—for example, that the Vth of the memory cells (e.g., 240) is at certain state levels indicating that at least the 4's bit information has been programmed. In response to the page-level reprogram state metadata 220 being the fourth value V4, the program logic section 215 may program the 8's bit of each of the memory cells (e.g., 240) to represent each data bit in the "0 0 0 1 1 1" string of data to be programmed. In this example embodiment, additional charge may be added to the memory cell 240 to bring the threshold voltage Vth up (+8) by eight levels to a state level representing "1 0 1 1." In this manner, the 1's bit, 2's bit, and 4's bit information is preserved irrespective of whether additional charge is added or not. Such a programming operation is additive and requires neither an erase nor a read of the memory cell 240. In other words, during the programming operation P3, the program logic section 215 may either add additional charge to bring the threshold voltage Vth up (+8) by eight levels (as in the case of memory cell 240, and the two memory cells to the write of the memory cell 240), or to otherwise add zero charge (+0) to the memory cell (as in the case of the right-most three memory cells).

For those memory cells in which an additional electrical charge is added, the threshold voltage Vth is changed, and thus, the state level for memory cell 240, for example, is changed to "1 0 1 1." The next two memory cells to the right have additional electrical charge added as well, which means that their threshold voltage Vth is also changed, and thus, their state level is changed to "1 1 0 1" and "1 0 1 0," respectively. The next three memory cells have no additional charge added during the programming operation P3, thereby preserving the 1's bit, the 2's bit, and the 4's bit information, while also leaving the 8's bit information unchanged. In this manner, the 1's bit, the 2's bit, the 4's bit, and the 8's bit information is preserved irrespective of whether additional charge is added or not.

Accordingly, some of the floating gates (e.g., 120 of FIG. 1) of the memory cells receive an added charge (+8) to represent a logical value of 0. Moreover, some of the memory cells receive no added charge (+0) to represent a logical value of 1. In this manner, the "0 0 0 1 1 1" logical values may be programmed into the 8's bit locations of the memory cells. The program logic section 215 may program the third state level (e.g., 1011, 1101, 1010, 0000, 0100, 0001) associated with the fourth power of two (e.g., 8's bit) of each of the memory cells during the third programming operation P3 without erasing any bit from among the memory cells being programmed. As part of (or after) the programming operation P3, the memory control logic section 210 may set the page-level reprogram state metadata 220 to a fifth value V5, which indicates that four levels of programming have occurred.

In some embodiments, the page-level reprogram state metadata 220 is a three-bit value capable of representing at least five values (V1, V2, V3, V4, and V5). For example, if the page-level reprogram state metadata 220 is equivalent to V1 or '000,' this may indicate that no programming has occurred on a particular memory page, and/or that the memory page is erased. If the page-level reprogram state metadata 220 is equivalent to V2 or '001,' this may indicate that 1's bit programming has occurred on the particular memory page. If the page-level reprogram state metadata 220 is equivalent to V3 or '010,' this may indicate that 2's bit programming has occurred on the particular memory page. If the page-level reprogram state metadata 220 is equivalent to the V4 or '011,' this may indicate that 4's bit programming has occurred on the particular memory page. And if the page-level reprogram state metadata 220 is equivalent to the V5 or '100,' this may indicate that 8's bit programming has occurred on the particular memory page. It will be understood that the page-level reprogram state metadata 220 need not be limited to a three-bit value, but may be stored and accessed using any suitable binary representation. Other combinations of bit values to page-level reprogram state metadata 220 values can be used without departing from the scope of the inventive embodiments disclosed herein.

Accordingly, the program logic section 215 may program the first state level (e.g., '0001') associated with the first power of two (e.g., 1's bit), may simultaneously program the second state level (e.g., '0011') associated with the second power of two (e.g., 2's bit) and the third power of two (e.g., 4's bit), and may program the third state level (e.g., '1011') associated with the fourth power of two (e.g., 8's bit) at a same address (i.e., an address associated with memory cell 240) without erasing any bit from among the memory cells during or between programming of the first state level, the second state level, and the third state level. The program logic section 215 may program the first state level associated with the first power of two (e.g., 1's bit) of each of the memory cells during the first programming operation P1 without erasing any bit from among the memory cells being programmed. The program logic section 215 may simultaneously program the second state level associated with the second power of two (e.g., 2's bit) and the third power of two (e.g., 4's bit) of each of the memory cells during the second programming operation P2 without erasing any bit from among the memory cells being programmed. The program logic section 215 may program the third state level associated with the fourth power of two (e.g., 8's bit) of each of the memory cells during the fourth programming operation P3 without erasing any bit from among the memory cells being programmed.

The third state level (e.g., 1011, 1101, 1010, 0000, 0100, 0001) of each of the memory cells may correspond to a third value of the threshold voltage Vth. The third value of the threshold voltage Vth includes information stored in a bit location associated with a fourth power of two (e.g., 8's bit) of each of the memory cells. The read logic section 235 may optionally read the information stored in the bit location associated with the fourth power of two (e.g., 8's bit) of each of the memory cells dependent on the fifth value V5 of the page-level reprogram state metadata 220. In other words, the read logic section 235 may access the page-level reprogram state metadata 220, determine that it has the fifth value V5, and based on that determination, know to read the 8's bit information. Such a read operation may occur at any time after the 8's bit information has been programmed, but reading is not required for the programming operations described above to be successfully carried out.

Thus, as compared to the example embodiment of FIG. 3A, which allows for only 6 bit strings to be written up to four (4) times, the example embodiment with reference to FIG. 3B allows for much greater flexibility, and without the usual erase or read operations interjected between the write operations. As described in detail with reference to FIG. 3B, the data string to be written can include multiple bit pairs (e.g., 10, 01, 10, 11, 01, 11). It will be understood that bit triples may be written in a similar fashion. It will also be understood that bit singles may also be written in a similar fashion. Indeed, any suitable combination of bit singles, bit pairs, bit triples, bit quadruples, or the like, can be written to the multi-level memory cells simultaneously in accordance with the embodiments described herein. For example, one 24 bit write, two 12 bit writes, four 6 bit writes, or the like may be carried out in succession. In the case of two 12 bit writes, for example, a first 12 bit write may include a simultaneous programming of 12 bits, followed by a second 12 bit write that includes another simultaneous programming of another 12 bits, without the usual erase or read operations interjected between the programming operations. By way of another example, two 6 bit writes followed by one 12 bit write may be carried out in succession, without the usual erase or read operations interjected between the programming operations. By way of yet another example, one 6 bit write may be followed by one 18 bit write, without the usual erase or read operations interjected between the programming operations. Any suitable combination of different-bit writes may be carried out in succession, without the usual erase or read operations interjected between the programming operations, as long as the lower order bits are not re-used for later writes, and proper state keeping is kept.

Figure 4:
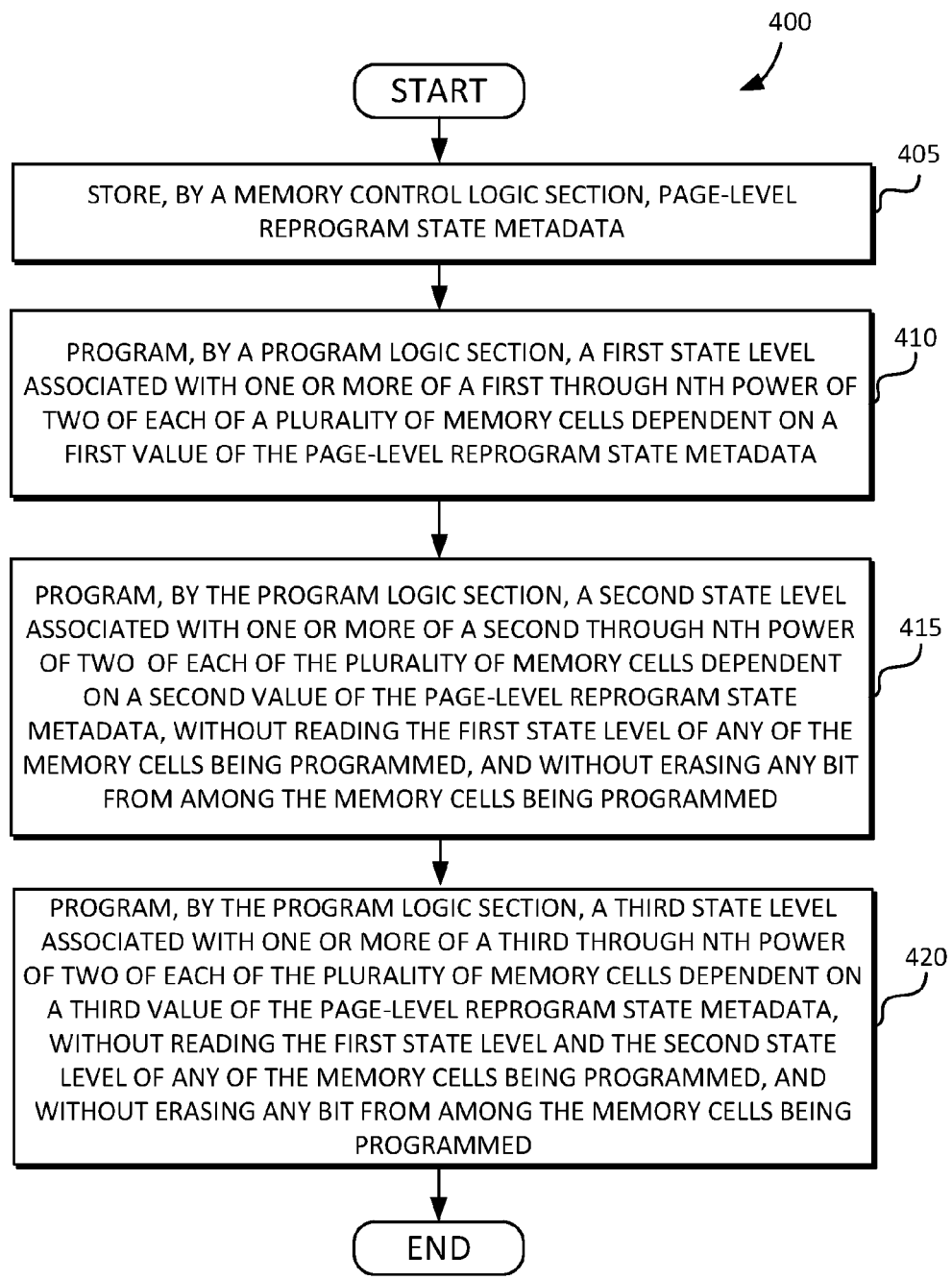
FIG. 4 is a flow diagram illustrating a technique for programming without erase using capacity in multi-level memory cells in accordance with embodiments of the inventive concept.

FIG. 4 is a flow diagram 400 illustrating a technique for programming without erase using capacity in multi-level memory cells in accordance with embodiments of the inventive concept. At 405, a memory control logic section may store page-level reprogram state metadata. For example, a previous program level may be stored as page-level reprogram state metadata, which may be referenced for the next program level. More specifically, the page-level reprogram state metadata may indicate the no information is stored yet in the memory cells of a particular memory page, or that first, second, third, fourth, etc., levels of programming have already occurred on the memory cells of the particular memory page. At 410, the program logic section may program a first state level associated with one or more of a first through Nth power of two of each of a plurality of memory cells dependent on a first value of the page-level reprogram state metadata. At 415, the program logic section may program a second state level associated with one or more of a second through Nth power of two of each of the plurality of memory cells dependent on a second value of the page-level reprogram state metadata, without reading the first state level of any of the memory cells being programmed, and without erasing any bit from among the memory cells being programmed. At 420, the program logic section may program a third state level associated with one or more of a third through Nth power of two of each of the plurality of memory cells dependent on a third value of the page-level reprogram state metadata, without reading the first state level and/or the second state level of any of the memory cells being programmed, and without erasing any bit from among the memory cells being programmed. It will be understood that the steps need not performed in the order illustrated, but rather, may be performed in a different order and/or with intervening steps. Furthermore, certain steps can be repeated in embodiments where the flash cell is capable of holding more levels of information.

Figure 5:
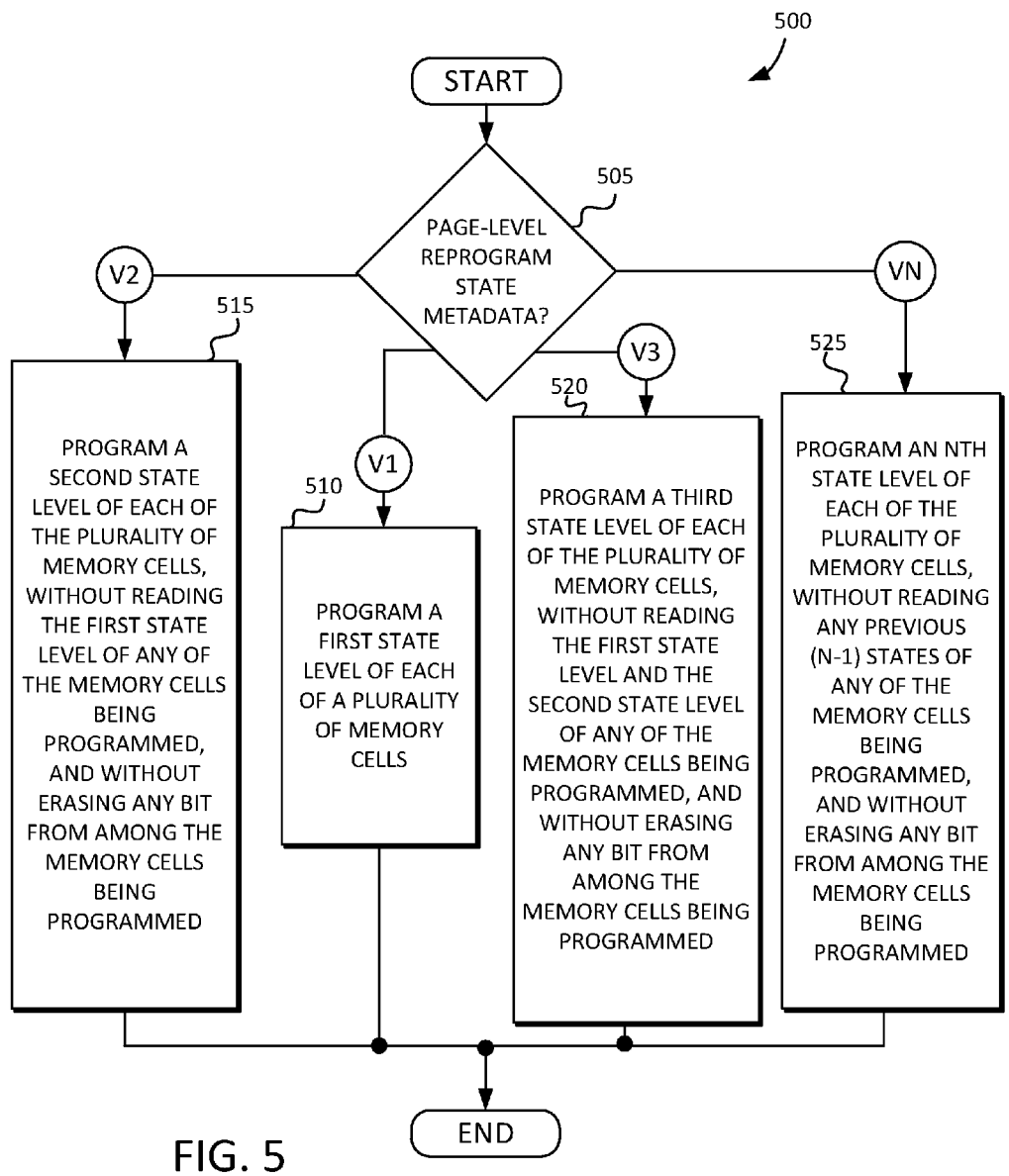
FIG. 5 is a flow diagram illustrating another technique for programming without erase using capacity in multi-level memory cells in accordance with embodiments of the inventive concept.

FIG. 5 is a flow diagram 500 illustrating another technique for programming without erase using capacity in multi-level memory cells in accordance with embodiments of the inventive concept. At 505, a determination may be made as to the present value of the page-level reprogram state metadata. When the value is V1, meaning that the memory page is presently in an erased state, then the flow can proceed to 510 where a first state level of each of a plurality of memory cells may be programmed. When the value is V2, meaning that one programming level has occurred since the last erase operation, then the flow can proceed to 515 where a second state level of each of a plurality of memory cells may be programmed, without reading the first state level of any of the memory cells being programmed, and without erasing any bit from among the memory cells being programmed. When the value is V3, meaning that two programming levels have occurred since the last erase operation, then the flow can proceed to 520 where a third state level of each of a plurality of memory cells may be programmed, without reading the first state level and/or the second state level of any of the memory cells being programmed, and without erasing any bit from among the memory cells being programmed. When the value is VN, meaning that (N−1) programming levels have occurred since the last erase operation, then the flow can proceed to 525 where an Nth state level of each of a plurality of memory cells may be programmed, without reading any previous (N−1) state levels of any of the memory cells being programmed, and without erasing any bit from among the memory cells being programmed. It will be understood that the steps need not performed in the order illustrated, but rather, may be performed in a different order and/or with intervening steps. Furthermore, similar steps may be added or removed based on the storage capabilities of the cells comprising the page.

Figure 6:
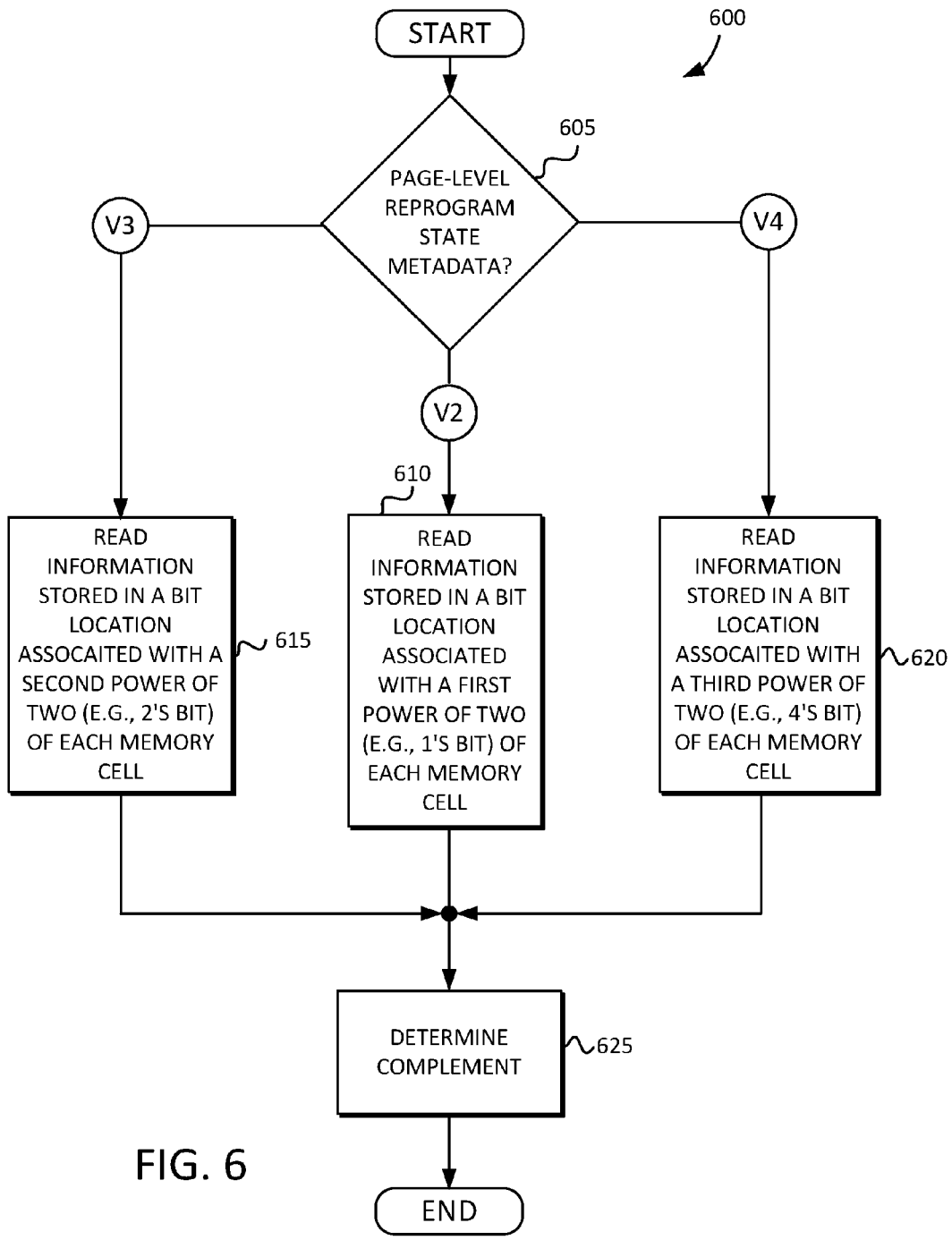
FIG. 6 is a flow diagram illustrating a technique for reading information from multi-level memory cells in accordance with embodiments of the inventive concept.

FIG. 6 is a flow diagram 600 illustrating a technique for reading information from multi-level memory cells in accordance with embodiments of the inventive concept. At 605, a determination may be made as to the present value of the page-level reprogram state metadata. When the value is V2, meaning that one programming level has occurred on the memory page, the flow can proceed to 610, where information stored in the 1's bit of each memory cell may be read and complemented, at 625, to get the original logical value. When the value is V3, meaning that two programming levels have occurred on the memory page, the flow can proceed to 615, where information stored in the 2's bit of each memory cell may be read and complemented, at 625, to get the original logical value. When the value is V4, meaning that three programming levels have occurred on the memory page, the flow can proceed to 620, where information stored in the 4's bit of each memory cell may be read. After reading the 1's, 2's, or 4's bit, etc., of each memory cell, a complement of that bit can be determined at 625 to get the final logical value, for example, as shown in FIGS. 2 and 3A. It will be understood that the steps need not performed in the order illustrated, but rather, may be performed in a different order and/or with intervening steps. Also, as explained above, prior stored values can be read and complemented.

Figure 7:
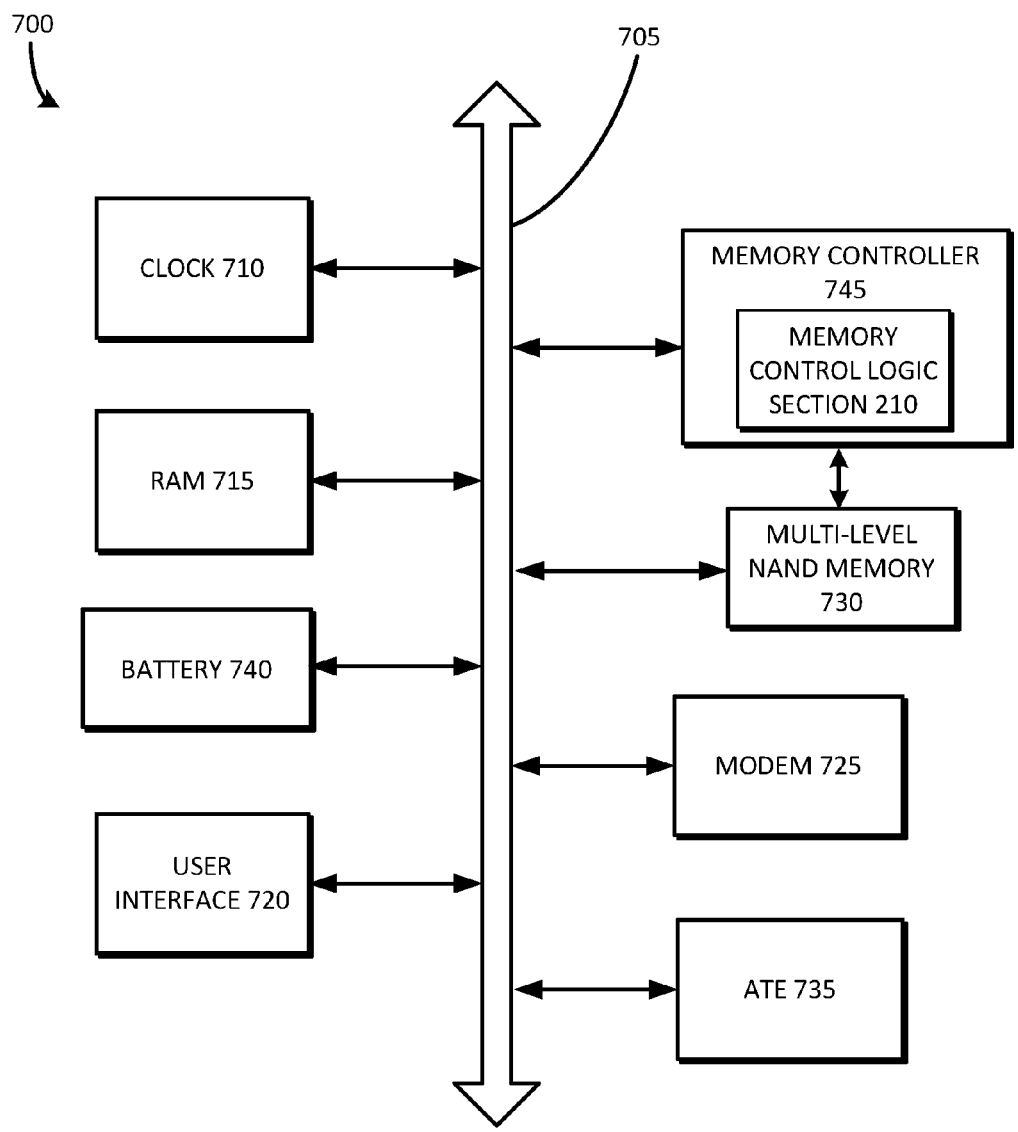
FIG. 7 is an example block diagram of a computing system including the memory control logic section of FIG. 2 according to embodiments of the inventive concept as disclosed herein.

FIG. 7 is an example block diagram of a computing system 700 including the memory control logic section 210 of FIG. 2 according to embodiments of the inventive concept as disclosed herein. A memory controller 745 may include the memory control logic section 210 described above. The memory controller 745 may be electrically connected to a system bus 705. The computing system 700 may also include multi-level NAND memory 730, a clock 710, a random access memory (RAM) 715, a user interface 720, a modem 725 such as a baseband chipset, and/or automated test equipment (ATE) 735, any or all of which may be electrically coupled to the system bus 705.

If the computing system 700 is a mobile device, it may further include a battery 740, which powers the computing system 700. Although not shown in FIG. 7, the computing system 700 may further include an application chipset, a camera image processor (CIS), a mobile DRAM, and the like. The memory controller 745 and the multi-level NAND memory 730 may constitute a solid state drive/disk (SSD), which uses a nonvolatile memory to store data.

In example embodiments, the computing system 700 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

Some embodiments include a memory device, comprising one or more memory pages including a plurality of memory cells each having a plurality of programmable state levels, and a memory control logic section coupled to the one or more memory pages, the memory control logic section including a program logic section and page-level reprogram state metadata. In some embodiments, the program logic section is configured to program a first state level associated with one or more of a first through Nth power of two of each of the memory cells, in a first programming of the plurality of memory cells dependent on a first value of the page-level reprogram state metadata. In some embodiments, the program logic section is configured to program a second state level associated with one or more of a second through Nth power of two of each of the memory cells in a second programming of the plurality of memory cells dependent on a second value of the page-level reprogram state metadata, without reading the first state level of any of the plurality of memory cells.

In some embodiments, the program logic section is configured to program a third state level associated with one or more of a third through Nth power of two of each of the memory cells in a third programming of the plurality of memory cells dependent on a third value of the page-level reprogram state metadata, without reading the first state level and the second state level of any of the plurality of memory cells. In some embodiments, the program logic section is configured to program the first state level, the second state level, and the third state level at a same address of each of the memory cells without erasing any bit from among the plurality of memory cells during or between programming of the first state level, the second state level, and the third state level.

In some embodiments, the first power of two corresponds to a 1's bit location, the second power of two corresponds to a 2's bit location, the third power of two corresponds to a 4's bit location, and the Nth power of two corresponds to a $2^{(N-1)}$'s bit location.

In some embodiments, the program logic section is configured to program the first state level of each of the memory cells without erasing any bit from among the plurality of memory cells during the first programming. In some embodiments, the program logic section is configured to program the second state level of each of the memory cells without erasing any bit from among the plurality memory cells during the second programming.

In some embodiments, the program logic section is configured to program a third state level of each of the memory cells in a third programming of the plurality of memory cells dependent on a third value of the page-level reprogram state metadata, without reading the first state level and the second state level of any of the plurality of memory cells. In some embodiments, the program logic section is configured to program the first state level of each of the memory cells without erasing any bit from among the plurality of memory cells during the first programming. In some embodiments, the program logic section is configured to program the second state level of each of the memory cells without erasing any bit from among the plurality of memory cells during the second programming. In some embodiments, the program logic section is configured to program the third state level of each of the memory cells without erasing any bit from among the plurality of memory cells during the third programming.

In some embodiments, the memory control logic section includes a read logic section. In some embodiments, the first state level of each of the memory cells corresponds to a first value of a threshold voltage Vth. In some embodiments, the first value of the threshold voltage Vth includes information stored in bit locations associated with the one or more of the first through Nth power of two of each of the memory cells. In some embodiments, the read logic section is configured to read the information stored in the bit locations associated with the one or more of the first through Nth power of two of each of the memory cells dependent on the second value of the page-level reprogram state metadata.

In some embodiments, the second state level of each of the memory cells corresponds to a second value of the threshold voltage Vth, the second value of the threshold voltage Vth includes information stored in bit locations associated with the one or more of the first through Nth power of two of each of the memory cells, and the read logic section is configured to read the information stored in the bit locations associated with the one or more of the first through Nth power of two of each of the memory cells dependent on a third value of the page-level reprogram state metadata.

In some embodiments, the program logic section is configured to program a third state level associated with one or more of a third through Nth power of two of each of the memory cells in a third programming of the plurality of memory cells dependent on the third value of the page-level reprogram state metadata, without reading the first or second state levels of any of the plurality of memory cells. In some embodiments, the third state level of each of the memory cells corresponds to a third value of the threshold voltage Vth. In some embodiments, the third value of the threshold voltage Vth includes information stored in bit locations associated with the one or more of the first through Nth power of two of each of the memory cells. In some embodiments, the read logic section is configured to read the information stored in the bit locations associated with the one or more of the first through Nth power of two of each of the memory cells dependent on a fourth value of the page-level reprogram state metadata.

In some embodiments, the memory control logic section is configured to set the page-level reprogram state metadata to the second value after programming of the first state level of each of the memory cells. In some embodiments, the memory control logic section is configured to set the page-level reprogram state metadata to the third value after programming of the second state level of each of the memory cells.

In some embodiments, the program logic section is configured to program a third state level associated with one or more of a third through Nth power of two of each of the memory cells in a third programming of the plurality of memory cells dependent on a third value of the page-level reprogram state metadata, without reading the first state level and the second state level of any of the plurality of memory cells. In some embodiments, the memory control logic section is configured to set the page-level reprogram state metadata to a fourth value after programming of the third state level of each of the memory cells.

Some embodiments include a method for programming multi-level non-volatile memory cells. The method may include storing, by a memory control logic section, page-level reprogram state metadata. The method may include programming, by a program logic section of the memory control logic section, a plurality of memory cells of a memory page dependent on the page-level reprogram state metadata. The method may include programming, by the program logic section, a first state level associated with one or more of a first through Nth power of two of each of the memory cells in a first programming of the plurality of memory cells dependent on a first value of the page-level reprogram state metadata. The method may include programming, by the program logic section, a second state level associated with one or more of a second through Nth power of two of each of the memory cells in a second programming of the plurality of memory cells dependent on a second value of the page-level reprogram state metadata, without reading the first state level of any of the plurality of memory cells.

The method may include programming, by the program logic section, a third state level associated with one or more of a third through Nth power of two of each of the memory cells in a third programming of the plurality of memory cells dependent on a third value of the page-level reprogram state metadata, without reading the first state level and the second state level of any of the plurality of memory cells. The method may include programming, by the program logic section, the first state level, the second state level, and the third state level at a same address of each of the memory cells without erasing any bit from among the plurality of memory cells during or between programming of the first state level, the second state level, and the third state level.

The method may include programming, by the program logic section, the first state level of each of the memory cells without erasing any bit from among the plurality of memory cells during the first programming. The method may include programming, by the program logic section, the second state level of each of the memory cells without erasing any bit from among the plurality memory cells during the second programming.

The method may include programming, by the program logic section, a third state level associated with one or more of a third through Nth power of two of each of the memory cells in a third programming of the plurality of memory cells dependent on a third value of the page-level reprogram state metadata, without reading the first state level and the second state level of any of the plurality of memory cells. The method may include programming, by the program logic section, the first state level of each of the memory cells without erasing any bit from among the plurality of memory cells during the first programming. The method may include programming, by the program logic section, the second state level of each of the memory cells without erasing any bit from among the plurality of memory cells during the second programming. The method may include programming, by the program logic section, the third state level of each of the memory cells without erasing any bit from among the plurality of memory cells during the third programming.

In some embodiments, the first state level of each of the memory cells corresponds to a first value of a threshold voltage Vth, and the first value of the threshold voltage Vth includes information stored in bit locations associated with the one or more of the first through Nth power of two of each of the memory cells. The method may include reading, by a read logic section of the memory control logic section, the information stored in the bit locations associated with the one or more of the first through Nth power of two of each of the memory cells dependent on the second value of the page-level reprogram state metadata. In some embodiments, the second state level of each of the memory cells corresponds to a second value of the threshold voltage Vth, and the second value of the threshold voltage Vth includes information stored in bit locations associated with the one or more of the first through Nth power of two of each of the memory cells. The method may include reading, by the reading logic section, the information stored in the bit locations associated with the one or more of the first through Nth power of two of each of the memory cells dependent on a third value of the page-level reprogram state metadata.

The method may include programming, by the program logic section, a third state level associated with one or more of a third through Nth power of two of each of the memory cells in a third programming of the plurality of memory cells dependent on the third value of the page-level reprogram state metadata, without reading the first state level and the second state level of any of the plurality of memory cells. In some embodiments, the third state level of each of the memory cells corresponds to a third value of the threshold voltage Vth. In some embodiments, the third value of the threshold voltage Vth includes information stored in bit locations associated with the one or more of the first through Nth power of two of each of the memory cells. The method may include reading, by the read logic section, the information stored in the bit location associated with the one or more of the first through Nth power of two of each of the memory cells dependent on a fourth value of the page-level reprogram state metadata.

The method may include setting, by the memory control logic section, the page-level reprogram state metadata to the second value after programming of the first state level of each of the memory cells. The method may include setting, by the memory control logic section, the page-level reprogram state metadata to the third value after programming of the second state level of each of the memory cells.

The method may include programming, by the program logic section, a third state level associated with one or more of a third through Nth power of two of each of the memory cells in a third programming of the plurality of memory cells dependent on a third value of the page-level reprogram state metadata, without reading the first state level and the second state level of any of the plurality of memory cells. The method may include setting, by the memory control logic section, the page-level reprogram state metadata to a fourth value after programming of the third state level of each of the memory cells.

Embodiments of the inventive concept may include a non-transitory machine-readable medium comprising instructions executable by one or more processors, the instructions comprising instructions to perform the elements of the inventive concepts as described herein.

What is claimed is:

1. A memory device, comprising:
   one or more memory pages including a plurality of memory cells each having a plurality of programmable state levels; and
   a memory control logic section coupled to the one or more memory pages, the memory control logic section including a program logic section and page-level reprogram state metadata,
   wherein the program logic section is configured to program a first state level associated with one or more of a first through Nth power of two of each of the memory cells, in a first programming of the plurality of memory cells dependent on a first value of the page-level reprogram state metadata; and
   wherein the program logic section is configured to program a second state level associated with one or more of a second through Nth power of two of each of the memory cells in a second programming of the plurality of memory cells dependent on a second value of the page-level reprogram state metadata, without reading the first state level of any of the plurality of memory cells.

2. The memory device of claim 1, wherein:
   the program logic section is configured to program a third state level associated with one or more of a third through Nth power of two of each of the memory cells in a third programming of the plurality of memory cells dependent on a third value of the page-level reprogram state metadata, without reading the first state level and the second state level of any of the plurality of memory cells; and the program logic section is configured to program the first state level, the second state level, and the third state level at a same address of each of the memory cells without erasing any bit from among the plurality of memory cells during or between programming of the first state level, the second state level, and the third state level.

3. The memory device of claim 2, wherein:
a first power of two from among the first through Nth power of two corresponds to a 1's bit location;
a second power of two from among the first through Nth power of two corresponds to a 2's bit location;
a third power of two from among the first through Nth power of two corresponds to a 4's bit location; and
an Nth power of two from among the first through Nth power of two corresponds to a 2(N−1)'s bit location.

4. The memory device of claim 1, wherein:
the program logic section is configured to program the first state level of each of the memory cells without erasing any bit from among the plurality of memory cells during the first programming; and
the program logic section is configured to program the second state level of each of the memory cells without erasing any bit from among the plurality memory cells during the second programming.

5. The memory device of claim 1, wherein:
the program logic section is configured to program a third state level of each of the memory cells in a third programming of the plurality of memory cells dependent on a third value of the page-level reprogram state metadata, without reading the first state level and the second state level of any of the plurality of memory cells;
the program logic section is configured to program the first state level of each of the memory cells without erasing any bit from among the plurality of memory cells during the first programming;
the program logic section is configured to program the second state level of each of the memory cells without erasing any bit from among the plurality of memory cells during the second programming; and
the program logic section is configured to program the third state level of each of the memory cells without erasing any bit from among the plurality of memory cells during the third programming.

6. The memory device of claim 1, wherein:
the memory control logic section includes a read logic section;
the first state level of each of the memory cells corresponds to a first value of a threshold voltage Vth;
the first value of the threshold voltage Vth includes information stored in bit locations associated with the one or more of the first through Nth power of two of each of the memory cells; and
the read logic section is configured to read the information stored in the bit locations associated with the one or more of the first through Nth power of two of each of the memory cells dependent on the second value of the page-level reprogram state metadata.

7. The memory device of claim 6, wherein:
the second state level of each of the memory cells corresponds to a second value of the threshold voltage Vth;
the second value of the threshold voltage Vth includes information stored in bit locations associated with the one or more of the first through Nth power of two of each of the memory cells; and
the read logic section is configured to read the information stored in the bit locations associated with the one or more of the first through Nth power of two of each of the memory cells dependent on a third value of the page-level reprogram state metadata.

8. The memory device of claim 7, wherein:
the program logic section is configured to program a third state level associated with one or more of a third through Nth power of two of each of the memory cells in a third programming of the plurality of memory cells dependent on the third value of the page-level reprogram state metadata, without reading the first or second state levels of any of the plurality of memory cells;
the third state level of each of the memory cells corresponds to a third value of the threshold voltage Vth;
the third value of the threshold voltage Vth includes information stored in bit locations associated with the one or more of the first through Nth power of two of each of the memory cells; and
the read logic section is configured to read the information stored in the bit locations associated with the one or more of the first through Nth power of two of each of the memory cells dependent on a fourth value of the page-level reprogram state metadata.

9. The memory device of claim 1, wherein:
the memory control logic section is configured to set the page-level reprogram state metadata to the second value after programming of the first state level of each of the memory cells; and
the memory control logic section is configured to set the page-level reprogram state metadata to a third value after programming of the second state level of each of the memory cells.

10. The memory device of claim 9, wherein:
the program logic section is configured to program a third state level associated with one or more of a third through Nth power of two of each of the memory cells in a third programming of the plurality of memory cells dependent on a third value of the page-level reprogram state metadata, without reading the first state level and the second state level of any of the plurality of memory cells; and
the memory control logic section is configured to set the page-level reprogram state metadata to a fourth value after programming of the third state level of each of the memory cells.

11. A method for programming multi-level non-volatile memory cells, the method comprising:
storing, by a memory control logic section, page-level reprogram state metadata;
programming, by a program logic section of the memory control logic section, a plurality of memory cells of a memory page dependent on the page-level reprogram state metadata;
programming, by the program logic section, a first state level associated with one or more of a first through Nth power of two of each of the memory cells in a first programming of the plurality of memory cells dependent on a first value of the page-level reprogram state metadata; and programming, by the program logic section, a second state level associated with one or more of a second through Nth power of two of each of the memory cells in a second programming of the plurality of memory cells dependent on a second value of the page-level reprogram state metadata, without reading the first state level of any of the plurality of memory cells.

12. The method of claim 11, further comprising:

programming, by the program logic section, a third state level associated with one or more of a third through Nth power of two of each of the memory cells in a third programming of the plurality of memory cells dependent on a third value of the page-level reprogram state metadata, without reading the first state level and the second state level of any of the plurality of memory cells; and programming, by the program logic section, the first state level, the second state level, and the third state level at a same address of each of the memory cells without erasing any bit from among the plurality of memory cells during or between programming of the first state level, the second state level, and the third state level.

13. The method of claim 12, wherein:

a first power of two from among the first through Nth power of two corresponds to a 1's bit location;

a second power of two from among the first through Nth power of two corresponds to a 2's bit location;

a third power of two from among the first through Nth power of two corresponds to a 4's bit location; and an Nth power of two from among the first through Nth power of two corresponds to a 2(N−1)'s bit location.

14. The method of claim 11, further comprising:

programming, by the program logic section, the first state level of each of the memory cells without erasing any bit from among the plurality of memory cells during the first programming; and programming, by the program logic section, the second state level of each of the memory cells without erasing any bit from among the plurality memory cells during the second programming.

15. The method of claim 11, further comprising:

programming, by the program logic section, a third state level associated with one or more of a third through Nth power of two of each of the memory cells in a third programming of the plurality of memory cells dependent on a third value of the page-level reprogram state metadata, without reading the first state level and the second state level of any of the plurality of memory cells;

programming, by the program logic section, the first state level of each of the memory cells without erasing any bit from among the plurality of memory cells during the first programming;

programming, by the program logic section, the second state level of each of the memory cells without erasing any bit from among the plurality of memory cells during the second programming; and programming, by the program logic section, the third state level of each of the memory cells without erasing any bit from among the plurality of memory cells during the third programming.

16. The method of claim 11, wherein the first state level of each of the memory cells corresponds to a first value of a threshold voltage Vth, and the first value of the threshold voltage Vth includes information stored in bit locations associated with the one or more of the first through Nth power of two of each of the memory cells, the method further comprising:

reading, by a read logic section of the memory control logic section, the information stored in the bit locations associated with the one or more of the first through Nth power of two of each of the memory cells dependent on the second value of the page-level reprogram state metadata.

17. The method of claim 16, wherein the second state level of each of the memory cells corresponds to a second value of the threshold voltage Vth, and the second value of the threshold voltage Vth includes information stored in bit locations associated with the one or more of the first through Nth power of two of each of the memory cells, the method further comprising:

reading, by the reading logic section, the information stored in the bit locations associated with the one or more of the first through Nth power of two of each of the memory cells dependent on a third value of the page-level reprogram state metadata.

18. The method of claim 17, further comprising:

programming, by the program logic section, a third state level associated with one or more of a third through Nth power of two of each of the memory cells in a third programming of the plurality of memory cells dependent on the third value of the page-level reprogram state metadata, without reading the first state level and the second state level of any of the plurality of memory cells;

wherein the third state level of each of the memory cells corresponds to a third value of the threshold voltage Vth;

wherein the third value of the threshold voltage Vth includes information stored in bit locations associated with the one or more of the first through Nth power of two of each of the memory cells; and the method further comprises reading, by the read logic section, the information stored in the bit location associated with the one or more of the first through Nth power of two of each of the memory cells dependent on a fourth value of the page-level reprogram state metadata.

19. The method of claim 11, further comprising:

setting, by the memory control logic section, the page-level reprogram state metadata to the second value after programming of the first state level of each of the memory cells; and setting, by the memory control logic section, the page-level reprogram state metadata to a third value after programming of the second state level of each of the memory cells.

20. The method of claim 19, further comprising:

programming, by the program logic section, a third state level associated with one or more of a third through Nth power of two of each of the memory cells in a third programming of the plurality of memory cells dependent on a third value of the page-level reprogram state metadata, without reading the first state level and the second state level of any of the plurality of memory cells; and setting, by the memory control logic section, the page-level reprogram state metadata to a fourth value after programming of the third state level of each of the memory cells.

* * * * *